(12) United States Patent  
Aoki

(10) Patent No.: US 7,237,133 B2  
(45) Date of Patent: Jun. 26, 2007

(54) POWER SUPPLY CONTROL CIRCUIT FOR MEMORIES, METHOD THEREOF AND APPARATUS EQUIPPED WITH MEMORIES

(75) Inventor: Takashi Aoki, Tokyo (JP)

(73) Assignee: Sony Corporation, Tokyo (JP)

( * ) Notice: Subject to any disclaimer, the term of this patent is extended or adjusted under 35 U.S.C. 154(b) by 343 days.

(21) Appl. No.: 10/864,468

(22) Filed: Jun. 10, 2004

(65) Prior Publication Data

US 2005/0018473 A1    Jan. 27, 2005

(30) Foreign Application Priority Data

Jun. 30, 2003   (JP) ............................. 2003-188423

(51) Int. Cl.
*G06F 1/26* (2006.01)
*G06F 1/32* (2006.01)
*G06F 12/10* (2006.01)
*G06F 12/12* (2006.01)

(52) U.S. Cl. ...................... 713/324; 713/300; 713/320; 713/322; 713/323; 711/100; 711/105

(58) Field of Classification Search ..................... None
See application file for complete search history.

(56) References Cited

U.S. PATENT DOCUMENTS

| 5,928,365 A * | 7/1999 | Yoshida ...................... 713/324 |
| 6,434,076 B1 * | 8/2002 | Andersen et al. ........... 365/222 |
| 6,831,873 B1 * | 12/2004 | Glassie ....................... 365/233 |
| 2002/0114204 A1 * | 8/2002 | Thijs et al. .................. 365/227 |
| 2003/0105932 A1 * | 6/2003 | David et al. ................ 711/167 |

* cited by examiner

*Primary Examiner*—James K. Trujillo
(74) *Attorney, Agent, or Firm*—Oblon, Spivak, McClelland, Maier & Neustadt, P.C.

(57) ABSTRACT

The power consumption is lowered in an apparatus equipped with memories. Assuming that memories are, for example, of DRAM type, each usage circumstance of DRAM modules on a chip is observed by an observation circuit and a power supply control signal is made to be generated by a CPU in order to turn off the power supply to the DRAM modules actually in a vacant condition, in a disused condition or in an unnecessary condition according to that circumstance observed result. It becomes possible to lower the power consumption as a whole apparatus by turning off only DRAM modules in a disused condition and the like according to the power supply control signal in the power supply on/off circuit.

9 Claims, 1 Drawing Sheet

Circuit constitution on a chip according to the present invention

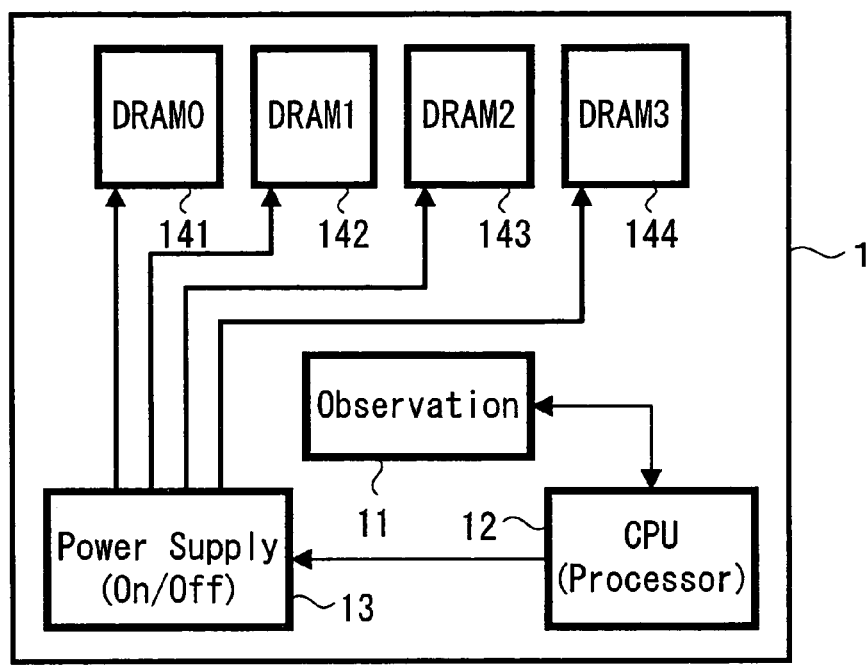
Circuit constitution on a chip according to the present invention
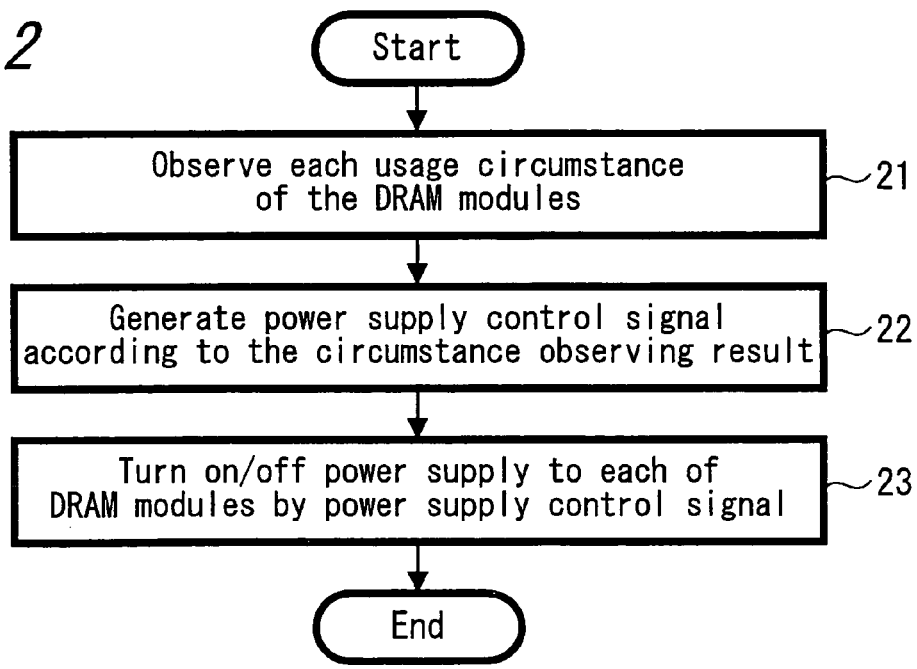
Power supply control flow according to the present invention

POWER SUPPLY CONTROL CIRCUIT FOR MEMORIES, METHOD THEREOF AND APPARATUS EQUIPPED WITH MEMORIES

BACKGROUND OF THE INVENTION

1. Field of the Invention

The present invention relates to a power supply control circuit for memories and a method thereof where in a situation of being mounted on a same chip together with a plurality of memory modules, a power supply to each of these memory modules are controlled per module or per bank in the module and further relates to an apparatus equipped with memories where it becomes possible to control the power supply to each of a plurality of memory modules.

2. Description of the Related Art

With respect to an LSI (Large Scale Integrated Circuit), for example, such as a system LSI, a high-capacity memory was realized generally by mounting a plurality of DRAM (Dynamic Random Access Memory) modules. However, all of these DRAM modules are not always in a used condition as memories and it is an actual situation that the power supply is switched on for the DRAM modules even though they are not being used.

Incidentally, there is shown a technique in a Patent Reference 1 where refreshing intervals of the DRAM are controlled and the refreshing intervals are made possible to be fully prolonged.

<Patent Reference 1>

Japanese Registered Patent No. 3177207

As mentioned above, the power was consumed unnecessarily in the prior art, because the power supply was always switched on also for the DRAM modules which are not in a used condition even though all of the plurality of DRAM modules mounted in the system LSI are not always in a used condition. Generally as a current classification for the DRAM, a refreshing current for rewriting data which are charged in capacitors is to be cited first and there can be cited other than that such as a leakage current of a transistor and the like and a penetrating current in a biasing circuit. However, a fact can not be denied that the power is consumed unnecessarily, because a refreshing operation is performed even though the data are unnecessary or the data are not used for a long time and further because there exists a leakage current or a penetrating current even if a refreshing operation is not performed.

SUMMARY OF THE INVENTION

In view of the aforesaid problem, the purpose of the present invention is to propose a power supply control circuit for memories and a method thereof where it becomes possible to lower the power consumption and further to propose an apparatus equipped with memories where it becomes possible to lower the power consumption by turning off each of the power supplies to the memory modules or banks actually in a vacant condition, in a disused condition or an unnecessary condition in a case when a plurality of memory modules are equipped on a same chip.

The power supply control circuit for memories according to the present invention is constituted such that the circuit comprises a observation circuit for observing each circumstance of the memory modules per module or per bank in the module; a processor responsive to a circumstance observing result from the observation circuit for generating a power supply control signal per module or per bank correspondence in order to turn off a power supply with respect to a memory module or a bank which is actually in a vacant condition, in a disused condition or an unnecessary condition; and a power supply on/off circuit responsive to the power supply control signal from the processor for turning on/off each of the power supplies to the memory modules per module or per bank.

In the observation circuit, it is made possible to detect memory modules or banks which are actually in a vacant condition, in a disused condition or an unnecessary condition, and a power supply control signal per module or per bank is generated from the processor in order to turn off the power supply only to these memory modules or banks. In the power supply on/off circuit, the power supply only to the memory modules or banks in a vacant condition, in a disused condition or an unnecessary condition is made turned off according to the power supply control signal, so that the power consumption in these memory modules or banks becomes definitely zero and consequently, it becomes possible to lower the power consumption as a whole.

Therefore, in a case when such a power supply control circuit is mounted integrally in an apparatus equipped with memories (more specifically in a system LSI, etc.), the more lowering of the power consumption is to be planned if the number of memory modules or banks in a vacant condition, in a disused condition or in an unnecessary condition becomes the more.

BRIEF DESCRIPTION OF THE DRAWINGS

FIG. 1 is a diagram on a chip showing a circuit constitutional example according to the present invention; and FIG. 2 is a diagram showing a schematic processing flow in one example of a method of a power supply control for memories according to the present invention.

DESCRIPTION OF THE PREFERRED EMBODIMENTS

Hereinafter, one exemplified embodiment of the present invention will be explained with reference to FIG. 1 and FIG. 2.

First, an apparatus equipped with memories according to the present invention will be explained assuming that memories (semiconductor memories) are DRAM. The apparatus equipped with memories is constituted such that at least a plurality of DRAM modules and a power supply control circuit for the DRAM are mounted on a same chip in a condition to be sealed in a package inside, and FIG. 1 shows a circuit constitutional example on the chip according to the present invention. As shown in the drawing, for example, four DRAM modules 141 to 144 are mounted on a chip 1 for on/off controlling objects of a power supply and a power supply control circuit is provided with respect to these DRAM modules 141 to 144.

The power supply control circuit is constituted so as to comprise an observation circuit 11 for observing each circumstance of DRAM modules 141 to 144 per module or per bank in the module; a CPU (central processing unit) (or processor) 12 responsive to a circumstance observing result from the observation circuit for generating a power supply control signal per module or per bank correspondence in order to turn off a power supply with respect to a DRAM module or a bank which is actually in a vacant condition, in a disused condition or an unnecessary condition; and a power supply on/off circuit 13 responsive to the power supply control signal from the processor for turning on/off each of the power supplies to the DRAM modules 141 to 144 per module or per bank. Incidentally, it can be considered that the an exclusive use for a power supply control, but a commercially available one can be used, that is, it can be provided for a general processing use. Further, the power supply on/off circuit 13 is provided with switching devices (p/n channel MOS transistors, MEMS <Micro Electro Mechanical Systems> switches, etc.) so as to be turned on/off according to the power supply control signal from the CPU 12.

Eventually, each usage circumstance of the DRAM modules 141 to 144 is observed by the observation circuit 11 at the standby operation or at a normal operation and as the observed result, a DRAM module or a bank actually in a vacant condition, in a disused condition or in a unnecessary condition is to be detected. A power supply control signal is generated per module or per bank correspondence from the CPU 12 responsive to the observed result so as to turn off each of only the power supplies to the DRAM modules or banks which were detected in that manner. Incidentally, the each usage circumstance of the DRAM module 141 to 144 is managed not by the CPU 12 but by an OS (operating system).

The power supply on/off circuit 13 is constituted such that the power supplies only to DRAM modules or banks in a vacant condition, in a disused condition or in an unnecessary condition are turned off according to the power supply control signal. In this manner, the power consumption as a whole can be planned to become lower as a result that the power is not consumed in the DRAM modules or banks at all if the power supply thereto is turned off. As a matter of course, if the power supply to a DRAM module or bank is turned off, the data therein will disappear according to the DRAM characteristic. Further, in a case when a necessity occurs where the DRAM module or bank is to be used as a memory at a normal condition which is returned from a standby condition and the like in a condition that the power supply to the DRAM module or the bank is turned off as mentioned above, it is possible to make the power supply supplied to the DRAM module or the bank immediately by using the power supply control signal from the CPU 12 so as to put it in an active condition.

Now, the memory module or bank in a vacant condition, in a disused condition or in an unnecessary condition includes a DRAM module or bank in which unnecessary data are stored as a matter of course and also includes a DRAM module or bank in which data are stored in such a manner that they have not been used for a long time though there is a possibility that they may be used later on. If the data are shifted and memorized in an external memory (flash memory, etc.) out of the chip, it can be assumed that any more unnecessary data are stored in that DRAM module or bank.

Further, in a case when effective data are dispersed and stored in DRAM modules 141 to 144 respectively, it is made possible to store these data intensively in, for example, DRAM modules 141 and 142 by means of a software control without a fragmentation occurring and also to turn off the power supply to these DRAM modules 143 and 144 by putting each of the DRAM modules 143 and 144 in an unnecessary condition.

To explain about this, the management of the DRAM is performed by the OS and a system region and an application (program) region are allotted to the DRAM. If a structure such as a filing system of an HDD (Hard Disk Drive) is employed, it becomes possible to manage how each application program is stored in what DRAM over how much address range, so that the relocation of data becomes possible. More specifically, if the application regions dispersed in respective DRAM modules 143 and 144 can be repacked into the DRAM modules 141 and 142 efficiently, for example, by utilizing vacant durations of the CPU 12 and the like, each of the DRAM modules 143 and 144 will be put in an unnecessary condition any more and therefore, it becomes possible to turn off the power supply to each of these DRAM modules 143 and 144.

In any case, a care is taken by software such that the data in the DRAM modules do not disperse with fragmentation occurring and the relocation of the data is always performed so that if unnecessary DRAM modules are produced in that manner, it is enough to turn off the power supply thereto.

As clear from the above explanation, the object of the power supply on/off control according to the present invention was targeted on DRAM modules exclusively, but it is not restricted by these and it is applicable to various types of memory modules other than DRAM modules. This is based on a fact that in the miniaturization process in recent years, the integration rate has been increased and the operation current itself has been decreased while the off leakage current which has nothing to do with the operation itself has been increased, so that caused by that fact, there has been an inclination for the power consumption of the whole chip not to decrease or on the contrary to increase conversely as compared with the process of the former generation.

As mentioned above, according to the apparatus equipped with memories of the present invention, the power consumption as a whole apparatus can be planned to become lower, because the power supply to the unnecessary memory modules are made turn off. Therefore, in case of mounting it in a mobile apparatus and the like, a long time operation by a battery becomes possible.

Finally, a power supply control method for the DRAM according to the present invention will be explained and a schematic processing flow in its one example is shown in FIG. 2. As shown in the figure, first, each usage circumstance of the DRAM modules is observed (step 21). Next, a power supply control signal is generated for each of the power supply objects according to the circumstance observing results (step 22). Further, it is designed such that the power supply to DRAM modules in a vacant condition, in a disused condition or in an unnecessary condition will be turned off responsive to the power supply control signal by turning on/off the switching devices already described (step 23).

Although the invention invented by the present inventor was explained concretely as above according to exemplified embodiments, but the present invention is not restricted by aforesaid exemplified embodiments and it is needless to say that various modifications van be achieved without departing from the scope within its essence.

In case of a plurality of memory modules mounted on a same chip, it can propose a power supply control circuit for memories and a method thereof where the power consumption is made to be lowered by turning off the power supplies to respective memory modules or banks actually in a vacant condition, in a disused condition or in an unnecessary condition, and can further propose an apparatus equipped with memories where the power consumption is made to be lowered.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. In a situation of being mounted on a same chip together with a plurality of memory modules, a power supply control circuit for memories for controlling the power supply to each of said memory modules per module or per bank in the module comprising:

an observation circuit for observing each circumstance of the memory modules per module or per bank in the module;

a processor responsive to a circumstance observing result from said observation circuit for generating a power supply control signal per module or per bank correspondence in order to turn off a power supply with respect to a memory module or a bank which is actually in a vacant condition, in a disused condition or an unnecessary condition, said processor configured to relocate data from a first module into an unused portion of a partially used second module without fragmentation such that the first module is placed in the disused condition; and a power supply on/off circuit responsive to the power supply control signal from said processor for turning on/off each of the power supplies to the memory modules per module or per bank.

2. A power supply control circuit for memories according to claim 1, wherein said processor is made to be a general use and not to be an exclusive use for a power supply control.

3. A power supply control circuit for memories according to claim 1, wherein said memory module or bank in a vacant condition, in a disused condition or in an unnecessary condition includes:

a module or bank for which data are already shifted and stored externally out of the chip; and a memory module or bank for which data relocation to another memory module or to another bank was finished without fragmentation occurring.

4. A power supply control method for memories for controlling the power supply to each of a plurality of memory modules which are mounted on a same chip per module or per bank in the module comprising:

a relocating step for relocating data from a first module to an unused portion of a partially used second module without fragmentation such that the first module is placed in a disused condition;

an observation step for observing each circumstance of the memory modules per module or per bank in the module;

a power supply control signal generating step responsive to a circumstance observing result by said observation step for generating a power supply control signal per module or per bank correspondence in order to turn off each of power supplies with respect to memory modules or banks which are actually in a vacant condition, in the disused condition or an unnecessary condition; and a power supply on/off step responsive to the power supply control signal generated in said power supply control signal generating step for turning on/off each of the power supplies to the memory modules per module or per bank.

5. A power supply control method for memories according to claim 4, wherein the power supply control signal is generated in said power supply control signal generate step by a processor which is made to be a general use and not to be an exclusive use for the power supply control.

6. A power supply control method for memories according to claim 4, wherein said memory module or bank in a vacant condition, in a disused condition or in an unnecessary condition includes:

a module or bank for which data are already shifted and stored externally out of the chip; and a memory module or bank for which data relocation to another memory module or to another bank was finished without fragmentation occurring.

7. An apparatus equipped with memories comprising:

a plurality of memory modules;

an observation circuit for observing each circumstance of said memory modules per module or per bank in the module;

a processor responsive to a circumstance observing result from said observation circuit for generating a power supply control signal per module or per bank correspondence in order to turn off power supplies with respect to memory modules or banks which are actually in a vacant condition, in a disused condition or an unnecessary condition, said processor configured to relocate data from a first module into an unused portion of a partially used second module without fragmentation such that the first module is placed in the disused condition; and a power supply on/off circuit responsive to the power supply control signal from said processor for turning on/off each of the power supplies to the memory modules per module or per bank, wherein they are on a same chip sealed in a package inside.

8. An apparatus equipped with memories according to claim 7, wherein said processor is made to be a general use and not to be an exclusive use for a power supply control.

9. An apparatus equipped with memories according to claim 7, wherein said memory module or bank in a vacant condition, in a disused condition or in an unnecessary condition includes:

a memory-finished memory module or bank of data evacuation to chip external;

a memory module or bank for which data are already shifted and stored externally out of the chip; and a memory module or bank for which data relocation to another memory module or to another bank was finished without fragmentation occurring.

* * * * *